(12) United States Patent
Kim

(10) Patent No.: US 9,078,362 B2
(45) Date of Patent: Jul. 7, 2015

(54) FLEXIBLE DISPLAY DEVICE

(71) Applicant: Samsung Display Co., Ltd., Yongin (KR)

(72) Inventor: Hyeong Gwon Kim, Suwon-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/267,757

(22) Filed: May 1, 2014

(65) Prior Publication Data

US 2015/0091434 A1   Apr. 2, 2015

(30) Foreign Application Priority Data

Sep. 30, 2013   (KR) .................. 10-2013-0116667

(51) Int. Cl.
| | | |
|---|---|---|
| H01L 51/52 | (2006.01) | |
| H01J 1/62 | (2006.01) | |
| H05K 1/02 | (2006.01) | |
| H01L 27/32 | (2006.01) | |

(52) U.S. Cl.
CPC ............... H05K 1/028 (2013.01); H01L 27/32 (2013.01); *H05K 2201/05* (2013.01)

(58) Field of Classification Search
CPC ............. H01L 2251/5338; H01L 51/0097; H01L 23/4985; H01L 23/5387; H01L 2924/12044; H01L 27/32; H05B 33/02; F21V 15/04; F21Y 2101/02; H05K 1/28; H05K 2201/05

USPC .................................. 313/498–512
See application file for complete search history.

(56) References Cited

U.S. PATENT DOCUMENTS

| | | | | |
|---|---|---|---|---|
| 6,160,967 | A  * | 12/2000 | Mizobuchi ................... | 396/542 |
| 8,304,978 | B2 * | 11/2012 | Kim et al. ..................... | 313/500 |
| 8,530,253 | B2 * | 9/2013 | Shin et al. ........................ | 438/29 |
| 2002/0105263 | A1* | 8/2002 | Kim ............................... | 313/498 |
| 2007/0171347 | A1* | 7/2007 | Nakanishi ..................... | 349/150 |
| 2007/0216846 | A1* | 9/2007 | Tseng et al. .................. | 349/149 |
| 2010/0220496 | A1* | 9/2010 | Kim ............................... | 362/606 |
| 2012/0127405 | A1* | 5/2012 | Lee et al. ....................... | 349/106 |
| 2013/0083496 | A1* | 4/2013 | Franklin et al. ............... | 361/749 |
| 2013/0148072 | A1* | 6/2013 | Jang et al. ..................... | 349/150 |

FOREIGN PATENT DOCUMENTS

| | | |
|---|---|---|
| JP | 2003-108040 A | 4/2003 |
| KR | 10-2001-0071409 A | 7/2001 |
| KR | 10-2008-0040929 A | 5/2008 |
| KR | 10-2008-0111339 A | 12/2008 |
| KR | 10-2013-0071143 A | 6/2013 |

* cited by examiner

*Primary Examiner* — Donald Raleigh
(74) *Attorney, Agent, or Firm* — Knobbe, Martens, Olson & Bear, LLP

(57) ABSTRACT

A flexible display device is disclosed. In one aspect, the flexible display device includes a flexible display panel and a printed circuit board attached to the flexible display panel. The printed circuit board includes a flexible area attached to a portion of the flexible display panel. The flexible area of the printed circuit board and the portion of the flexible display panel are configured to be deformed together.

19 Claims, 5 Drawing Sheets

FLEXIBLE DISPLAY DEVICE

CROSS-REFERENCE TO RELATED APPLICATIONS

This application claims priority to and the benefit of Korean Patent Application No. 10-2013-0116667 filed in the Korean Intellectual Property Office on Sep. 30, 2013, the entire contents of which are incorporated herein by reference.

BACKGROUND

1. Field

The described technology generally relates to a display device, and more particularly, to a display device having a flexible display panel.

2. Description of the Related Technology

Display devices include a number of integrated circuits electrically connected to a display panel. Images are displayed on the display panel when driven by the integrated circuits.

The integrated circuits can be mounted to a printed circuit board and the printed circuit board can be electrically connected to the display panel.

The above information disclosed in this Background section is only intended to facilitate the understanding of the background of the described technology and therefore it may contain information that does not constitute the prior art that is already known in this country to a person of ordinary skill in the art.

SUMMARY OF CERTAIN INVENTIVE ASPECTS

One inventive aspect is a display device including a printed circuit board which can be bent along with a flexible display panel.

Another aspect is a display device including a flexible display panel and a printed circuit board attached to the flexible display panel. The printed circuit board includes a flexible area that is flexible and can be deformed in shape according to deformation of the shape of the flexible display panel.

The printed circuit board includes a plurality of first areas and at least one second area disposed between the plurality of first areas and the second area may be the flexible area.

The second area may include a plurality of second areas on the printed circuit board.

The flexible area may include a polyimide.

The flexible area may include a polyimide layer and a coating layer provided to the surface of the polyimide layer.

The first area may be rigid.

The printed circuit board may include an integrated circuit and the integrated circuit may be provided in the first area.

The flexible display panel may be an organic light-emitting diode (OLED) display panel.

Another aspect is a flexible display device, comprising: a flexible display panel; and a printed circuit board attached to the flexible display panel, wherein the printed circuit board comprises a flexible area attached to a portion of the flexible display panel, and wherein the flexible area of the printed circuit board and the portion of the flexible display panel are configured to be deformed together.

In the above device, the printed circuit board further comprises a plurality of circuitry areas. In the above device, the flexible area comprises a plurality of flexible areas. In the above device, the flexible area is formed at least partially of polyimide. In the above device, the flexible area comprises a polyimide layer and a coating layer formed on a surface of the polyimide layer. In the above device, the coating layer is formed on opposing surfaces of the polyimide layer. In the above device, the circuitry areas are rigid.

In the above device, the printed circuit board comprises an integrated circuit configured to drive the flexible display and wherein the integrated circuit is formed in the circuitry areas. In the above device, the thickness of the flexible area is less than that of each of the circuitry areas. In the above device, the flexible display panel is an organic light-emitting diode (OLED) display panel.

Another aspect is a flexible display device, comprising: a flexible substrate including a display area; and a printed circuit board attached to the flexible substrate adjacent to the display area, wherein the printed circuit board comprises: a plurality of rigid areas each including a plurality of integrated circuits; and at least one flexible area formed between neighboring rigid areas.

In the above device, the flexible area comprises a polyimide layer and a coating layer formed on opposing surfaces of the polyimide layer. In the above device, each of the rigid areas further comprises a flexible printed circuit film including at least one of the integrated circuits. In the above device, the thickness of the flexible area is less than that of each of the rigid areas. In the above device, the flexible area comprises a plurality of flexible areas each respectively formed between neighboring rigid areas.

In the above device, the printed circuit board and the flexible substrate are configured to be deformed together. The above device further comprises: another flexible substrate opposing the flexible substrate; and a plurality of pixels formed between the flexible substrate and the other flexible substrate, wherein the pixels are formed in the display area. In the above device, the flexible area comprises a wiring pattern electrically connecting the integrated circuits of the rigid areas.

Another aspect is a flexible display device, comprising: a flexible display panel; and a printed circuit board having a flexible portion, wherein the flexible display panel and the flexible portion are configured to bend together along a common axis.

In the above device, the flexible printed circuit board comprises a plurality of rigid portions and a plurality of flexible portions and wherein the rigid portions and the flexible portions are alternately formed.

DETAILED DESCRIPTION OF CERTAIN INVENTIVE EMBODIMENTS

The described technology will be described more fully hereinafter with reference to the accompanying drawings, in which exemplary embodiments are shown. As those skilled in the art would realize, the described embodiments may be modified in various different ways, all without departing from the spirit or scope of the described technology.

Unless explicitly described to the contrary, the word "comprise" and variations such as "comprises" or "comprising" will be understood to imply the inclusion of stated elements but not the exclusion of any other elements. In addition, it will be understood that when an element such as a layer, film, region, or substrate is referred to as being "on" another element, it can be directly on the other element or intervening elements may also be present. Further, in the specification, the term "on" refers to the position on or below the specified object, but does not only refer to the position above the specified object based on the orientation of the device with respect to gravity.

Figure 1:
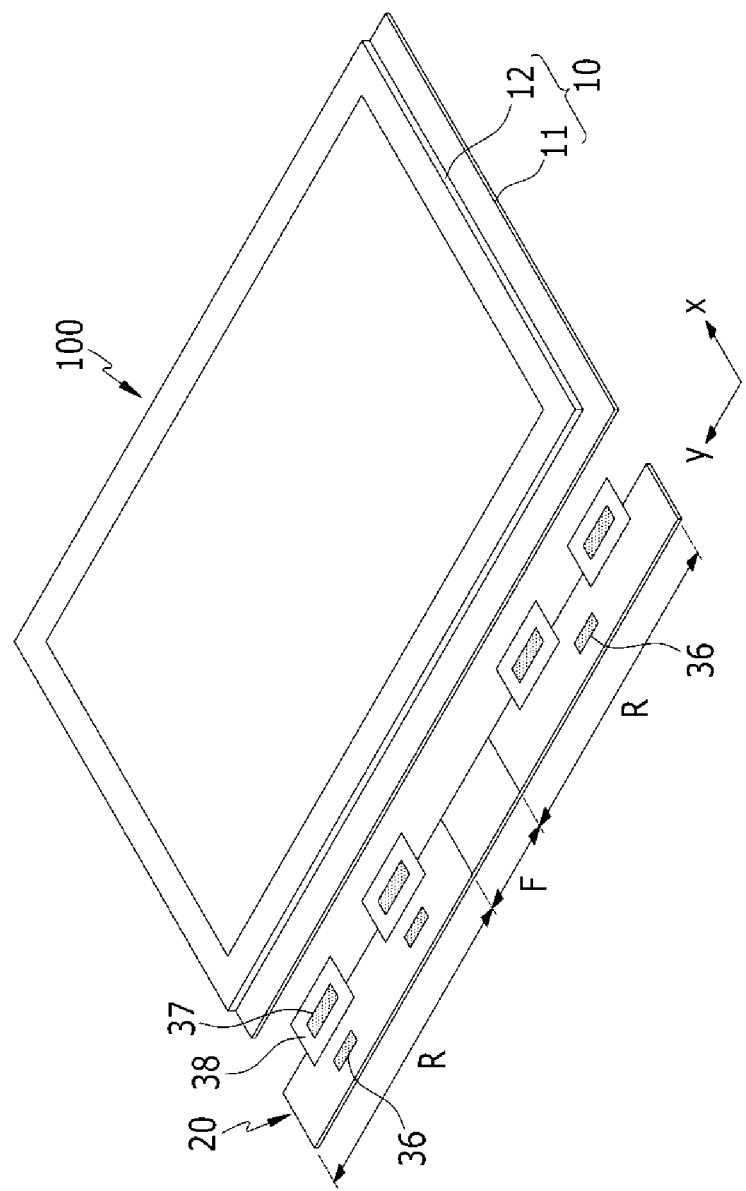
FIG. 1 is a partially exploded perspective view of a display device according to an exemplary embodiment.
Figure 2:
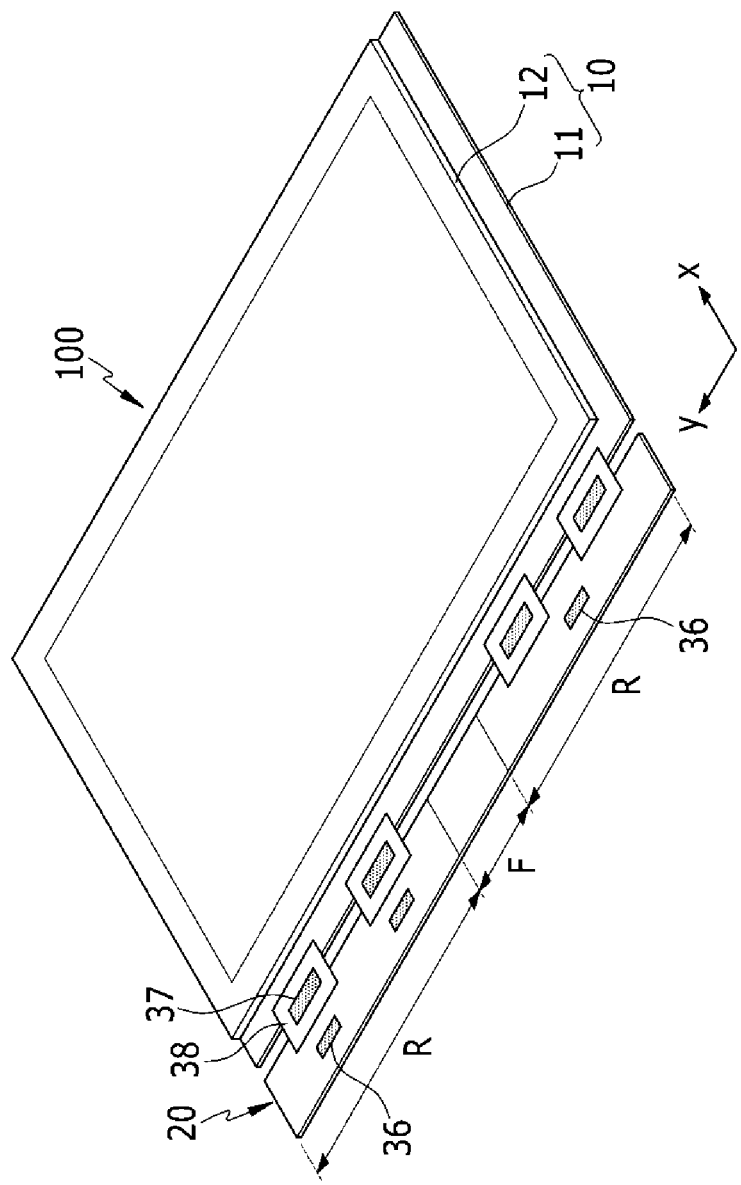
FIG. 2 is a perspective view of the display device of FIG. 1 with the printed circuit board attached to the display panel.

FIG. 1 is a partially exploded perspective view of a display device according to an exemplary embodiment. FIG. 2 is a combined perspective view of the display device of FIG. 1.

Referring to FIG. 1 and FIG. 2, a display device 100 includes a flexible display panel 10 which can display an image and a printed circuit board 20 electrically connected to the flexible display panel 10. The printed circuit board 20 includes a circuit pattern formed so as to transmit electrical signals for driving of the flexible display panel 10.

The flexible display panel 10 includes a first substrate 11 where a pixel array is formed and a second substrate 12 attached to the first substrate 11 and coving the pixel array. The first and second substrates 11 and 12 may be formed of a material such as a polymer film to provide flexibility. However, the material of the flexible display panel is not limited thereto. Any material that can provide flexibility to the display panel is can be used and the first and/or second substrates may be formed of a thin film.

In the configuration shown in FIGS. 1 and 2, the flexible display panel 10 is an organic light-emitting diode (OLED) display panel having a pixel array including a plurality of OLEDs. The display device 100 may be embodied as a large-scale television but the described technology is not limited thereto. Another embodiment of the display panel employs a liquid crystal display (LCD) technology. According to some embodiments, the flexible display panel 10 is greater than 8 inches in size.

As shown in FIG. 1, the flexible display panel 10 has a rectangular shape having a pair of long sides and a pair of short sides. The flexible printed circuit 20 is arranged at both of the long sides facing each other or at one of the long sides of the flexible display panel 10. The flexible printed circuit 20 is electrically connected to a corresponding signal line (e.g., a data line or a scan line) for driving the pixels of the pixel array. In FIG. 1 and FIG. 2, only one long side is illustrated for convenience of illustration. The electrical connections between the flexible display panel 10 and the flexible printed circuit 20 can be formed by a well-known method so no further description thereof will be provided.

In the configuration of FIGS. 1 and 2, the flexible printed circuit 20 is attached to a rear side of the first substrate 11 and then fixed and electrically connected to the first substrate 11. Thus, the flexible printed circuit 20 is bent along with the rear side of the first substrate 11. That is, the flexible printed circuit 20 may be integrally formed on the first substrate 11.

The flexible printed circuit 20 has a shape that is extended along the length direction (i.e., y-direction) of the flexible display panel 10. As described above, the flexible printed circuit 20 is formed in the shape of a rectangle having a pair of long sides and a pair of short sides.

Figure 3:
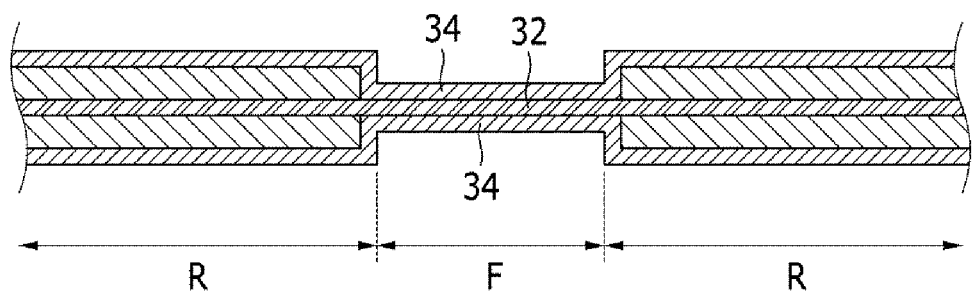
FIG. 3 is a partial cross-sectional view of a printed circuit board of FIG. 1 according to an exemplary embodiment.

The flexible printed circuit 20 includes rigid areas R and a flexible area F. The rigid areas R may be formed of multi-layered substrates including wiring patterns formed thereon and the flexible area F may be formed of a conductive layer including another wiring pattern. The rigid area R cannot be bent or folded but the flexible area F can be. In some embodiments, the flexible area F is formed of a polyimide layer 32 extending from the rigid layer R and a coating layer 34 is provided on the surface of a polyimide layer 32 for protection (refer to FIG. 3). The flexible area F may have an area and flexibility such that the printed circuit board can be deformed in the same manner as the flexible display panel 10 i.e. along the length direction (i.e., x-axis direction) of the flexible display panel 10.

Figure 5:
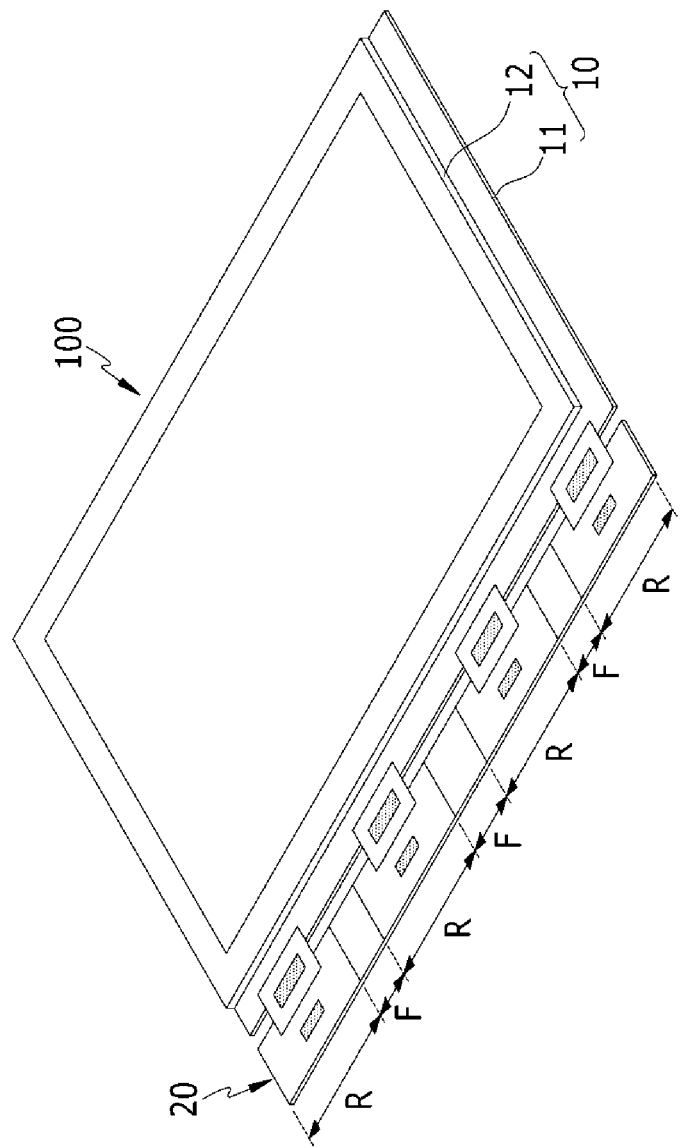
FIG. 5 is a partially exploded perspective view of a display device according to another exemplary embodiment.

In the flexible printed circuit 20 shown in FIG. 1 and FIG. 2, one flexible area F is formed between two rigid areas R, however, the configuration of the rigid area and the flexible areas is not limited thereto. For example, as shown in FIG. 5, the printed circuit board 20 may include four rigid areas R and three flexible areas F respectively formed between the rigid areas R. That is, in the embodiment of FIG. 5, the printed circuit board includes a plurality of rigid areas R and a plurality of flexible areas F. The space between the rigid areas R and the number of rigid and flexible areas R and F may be appropriately adjusted to select a degree of deformation of the flexible display panel 10.

An integrated circuit 36 for driving the flexible display panel 10 may be mounted in the rigid area R. A flexible printed circuit film 38 including another integrated circuit 37 for driving the flexible display panel 10 may be electrically connected to the rigid area R.

Figure 4:
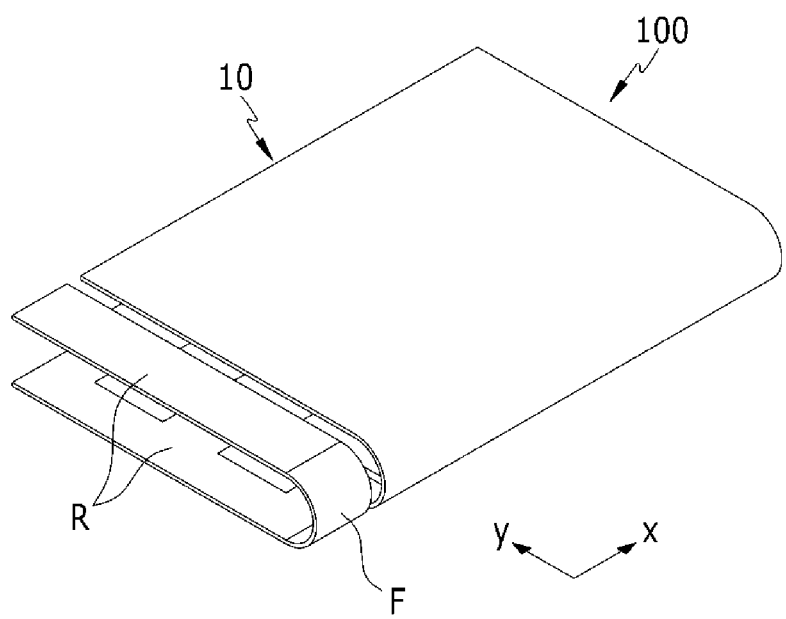
FIG. 4 is a perspective view showing the display device in a folded state according to an exemplary embodiment.

The flexible display panel 10 can be deformed, for example, as shown in FIG. 4. When the flexible display panel 10 is folded in half in the length direction (i.e., y-axis direction), the printed circuit board 20 is also folded in half at the flexible area F thereof in accordance with the deformation of the flexible display panel 10.

Therefore, the flexible display panel 10 of the display device 100 can be sufficiently flexible without interference of peripheral constituent elements like the printed circuit board 20.

In the configuration of FIG. 4, the printed circuit board 20 is formed at the outer side of the flexible display panel 10. However, in other embodiments, the printed circuit board 20 is formed in an inner portion of the flexible display panel 10 and the printed circuit board 20 can be bent along with the flexible display panel 10.

According to at least one embodiment, the display panel is a flexible display panel and a printed circuit board can be bent at a flexible area thereof when the flexible display panel is in a bent or folded state.

Accordingly, the display device includes a printed circuit board having an improved ability to be bent along with the flexible display panel so that the flexible display panel can be used as a flexible device. Further, the display device can be provided as a product providing high satisfaction to a user.

While the described technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. A flexible display device, comprising:
a flexible display panel;
a printed circuit board attached to the flexible display panel; and
a flexible printed circuit film,
wherein the printed circuit board is non-overlapping with the flexible display panel, wherein the printed circuit board comprises a flexible area attached to a portion of the flexible display panel, wherein the flexible area of the printed circuit board and the portion of the flexible display panel are configured to be deformed together, wherein the printed circuit board is attached to the flexible display panel via the flexible printed circuit film, and wherein the printed circuit board is electrically connected to the flexible display panel via the flexible printed circuit film.

2. The flexible display device of claim 1, wherein the printed circuit board further comprises a plurality of circuitry areas.

3. The flexible display device of claim 2, wherein the flexible area comprises a plurality of flexible areas.

4. The flexible display device of claim 1, wherein the flexible area is formed at least partially of polyimide.

5. The flexible display device of claim 4, wherein the flexible area comprises a polyimide layer and a coating layer formed on a surface of the polyimide layer.

6. The flexible display device of claim 5, wherein the coating layer is formed on opposing surfaces of the polyimide layer.

7. The flexible display device of claim 2, wherein the circuitry areas are rigid.

8. The flexible display device of claim 2, wherein the printed circuit board comprises an integrated circuit configured to drive the flexible display and wherein the integrated circuit is formed in the circuitry areas.

9. The flexible display device of claim 2, wherein the thickness of the flexible area is less than that of each of the circuitry areas.

10. The flexible display device of claim 1, wherein the flexible display panel is an organic light-emitting diode (OLED) display panel.

11. A flexible display device, comprising:
a flexible substrate including a display area; and
a printed circuit board attached to the flexible substrate adjacent to the display area, wherein the printed circuit board comprises:
 a plurality of rigid areas each including a plurality of integrated circuits; and
 at least one flexible area formed between neighboring rigid areas,
wherein each of the rigid areas further comprises a flexible printed circuit film including at least one second integrated circuit, wherein the printed circuit board is attached to the flexible display panel via the flexible printed circuit film, and wherein each of the first integrated circuits is electrically connected to the flexible substrate via the second integrated circuit.

12. The flexible display device of claim 11, wherein the flexible area comprises a polyimide layer and a coating layer formed on opposing surfaces of the polyimide layer.

13. The flexible display device of claim 11, wherein the thickness of the flexible area is less than that of each of the rigid areas.

14. The flexible display device of claim 11, wherein the flexible area comprises a plurality of flexible areas each respectively formed between neighboring rigid areas.

15. The flexible display device of claim 11, wherein the printed circuit board and the flexible substrate are configured to be deformed together.

16. The flexible display device of claim 11, further comprising:
another flexible substrate opposing the flexible substrate; and
a plurality of pixels formed between the flexible substrate and the other flexible substrate, wherein the pixels are formed in the display area.

17. The flexible display device of claim 11, wherein the flexible area comprises a wiring pattern electrically connecting the integrated circuits of the rigid areas.

18. A flexible display device, comprising:
a flexible display panel;
a printed circuit board having a flexible portion; and
a flexible printed circuit film,
wherein the printed circuit board is non-overlapping with the flexible display panel,
wherein the flexible display panel and the flexible portion are configured to bend together along a common axis,
wherein the printed circuit board is attached to the flexible display panel via the flexible printed circuit film, and
wherein the printed circuit board is electrically connected to the flexible display panel via the flexible printed circuit film.

19. The flexible display device of claim 18, wherein the flexible printed circuit board comprises a plurality of rigid portions and a plurality of flexible portions and wherein the rigid portions and the flexible portions are alternately formed.

* * * * *